United States Patent
Wamusango

(10) Patent No.: US 12,068,138 B2
(45) Date of Patent: Aug. 20, 2024

(54) SEMICONDUCTOR MANUFACTURING APPARATUS AND SEMICONDUCTOR DEVICE MANUFACTURING METHOD

(71) Applicant: Kioxia Corporation, Tokyo (JP)

(72) Inventor: Higenyi Ismail Wamusango, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 441 days.

(21) Appl. No.: 17/447,271

(22) Filed: Sep. 9, 2021

(65) Prior Publication Data

US 2022/0301831 A1    Sep. 22, 2022

(30) Foreign Application Priority Data

Mar. 18, 2021    (JP) ................. 2021-044652

(51) Int. Cl.
     *C23C 16/40*      (2006.01)
     *C23C 16/34*      (2006.01)
     *C23C 16/50*      (2006.01)
     *H01J 37/32*      (2006.01)

(52) U.S. Cl.
     CPC ...... *H01J 37/32568* (2013.01); *C23C 16/345* (2013.01); *C23C 16/402* (2013.01); *C23C 16/50* (2013.01); *H01J 37/32724* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 7,938,931 B2 | 5/2011 | Sexton et al. | |
| 8,083,890 B2 | 12/2011 | Fang et al. | |
| 2004/0238488 A1 | 12/2004 | Choi et al. | |
| 2022/0157563 A1* | 5/2022 | Sun | H01J 37/3405 |

FOREIGN PATENT DOCUMENTS

| | | |
|---|---|---|
| JP | 2005-5701 A | 1/2005 |
| JP | 2010-531538 A | 9/2010 |
| JP | 2011-511437 A | 4/2011 |

* cited by examiner

*Primary Examiner* — Charles Capozzi
(74) *Attorney, Agent, or Firm* — Finnegan, Henderson, Farabow, Garrett & Dunner, LLP

(57) ABSTRACT

A semiconductor manufacturing apparatus includes a heating part, a first electrode, a first insulating part, a gas supply part, a second electrode, and a second insulating part. The heating part is arranged to be in one surface side of a substrate. The first electrode is arranged around the heating part. The gas supply part is arranged to be in another surface side of the substrate. The second electrode is arranged around the gas supply part. The first electrode and the second electrode are arranged to overlap with an outer edge portion of the substrate, which is a region existing from an outer peripheral end of the substrate to a position inside by a predetermined length, in a direction in which the first electrode and the second electrode face each other. The first electrode is arranged to be in contact with part of the outer edge portion on the one surface side.

20 Claims, 5 Drawing Sheets

SEMICONDUCTOR MANUFACTURING APPARATUS AND SEMICONDUCTOR DEVICE MANUFACTURING METHOD

CROSS-REFERENCE TO RELATED APPLICATIONS

This application is based upon and claims the benefit of priority from Japanese Patent Application No. 2021-044652, filed on Mar. 18, 2021; the entire contents of which are incorporated herein by reference.

FIELD

An embodiment of the present invention described herein relates generally to a semiconductor manufacturing apparatus and a semiconductor device manufacturing method.

BACKGROUND

In a process of manufacturing semiconductor devices, a technology of processing an outer edge portion, which has a bevel shape, of a substrate is used. There is a case where a film is formed on the outer edge portion of a substrate for the purpose of protection or the like. However, with the conventional technology, since the film comes to have a shape curved along the bevel shape of the outer edge portion of the substrate, it is difficult to form a film in a flat state.

DETAILED DESCRIPTION

In general, according to one embodiment, a semiconductor manufacturing apparatus is provided. The semiconductor manufacturing apparatus includes a heating part, a first electrode, a first insulating part, a gas supply part, a second electrode, and a second insulating part. The heating part is arranged to be in one surface side of a substrate. The first electrode is arranged around the heating part. The first insulating part is arranged between the heating part and the first electrode. The gas supply part is arranged to be in another surface side of the substrate, and includes a structure to supply a gas toward the other surface. The second electrode is arranged around the gas supply part. The second insulating part is arranged between the gas supply part and the second electrode. The first electrode and the second electrode are arranged to overlap with an outer edge portion of the substrate, which is a region existing from an outer peripheral end of the substrate to a position inside by a predetermined length, in a direction in which the first electrode and the second electrode face each other. The first electrode is arranged to be in contact with part of the outer edge portion on the one surface side.

An exemplary embodiment of a semiconductor manufacturing apparatus and a semiconductor device manufacturing method will be explained below in detail with reference to the accompanying drawings. The present invention is not limited to the following embodiment. The constituent elements in the following embodiment encompass those which can be easily assumed by a person skilled in the art, or which are substantially equivalent thereto.

Figure 1:
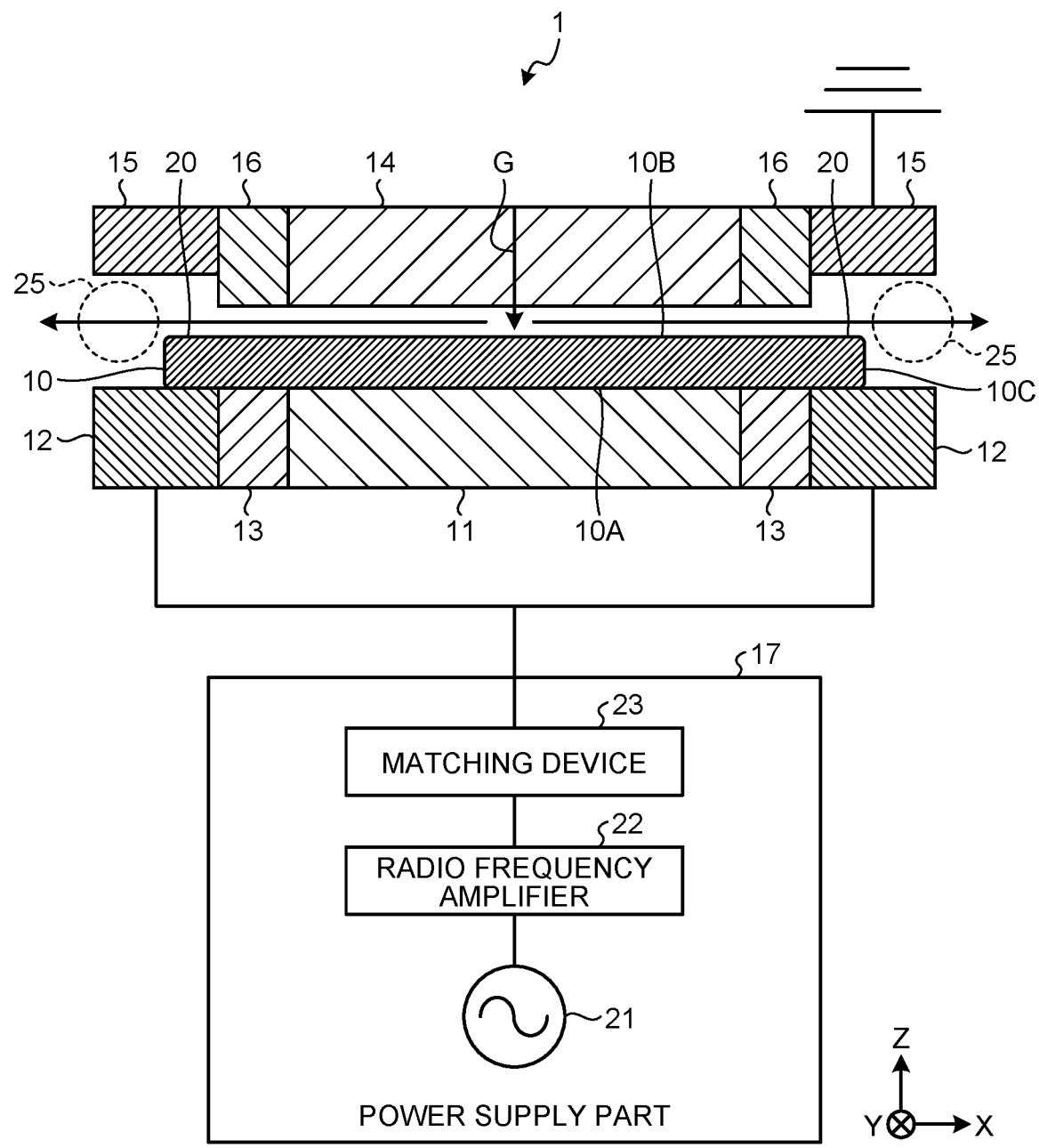
FIG. 1 is a sectional view schematically illustrating an example of the configuration of a semiconductor manufacturing apparatus according to an embodiment.

FIG. 1 is a sectional view schematically illustrating an example of the configuration of a semiconductor manufacturing apparatus 1 according to an embodiment. In FIG. 1, an X-axis corresponds to the horizontal direction, a Y-axis corresponds to the back-and-forth direction, and a Z-axis corresponds to the vertical (up-and-down) direction.

The semiconductor manufacturing apparatus 1 is an apparatus that can form a film on the outer edge portion 20 of a substrate 10, such as a silicon wafer. The outer edge portion 20 of the substrate 10 according to this embodiment has a bevel shape. The bevel shape encompasses a curved shape, inclined shape, and so forth.

The semiconductor manufacturing apparatus 1 includes a heater 11 (heating part), a lower electrode 12 (first electrode), a lower insulating part 13 (first insulating part), a showerhead 14 (gas supply part), an upper electrode 15 (second electrode), an upper insulating part 16 (second insulating part), and a power supply part 17.

The heater 11 is arranged in the lower surface 10A (one surface) side of the substrate 10 to heat the substrate 10 placed on the heater 11. The heater 11 according to this embodiment has a circular disk shape on which the substrate 10 having a circular disk shape can be placed.

The lower electrode 12 is an electrode arranged around the heater 11. The lower electrode 12 according to this embodiment has an annular shape with an inner diameter larger than the outer diameter of the heater 11 having the circular disk shape. The lower electrode 12 is connected to the power supply part 17, by which a radio frequency voltage is to be applied thereto.

The lower insulating part 13 is arranged between the heater 11 and the lower electrode 12 to block the electric conduction between the lower electrode 12 and the heater 11. The material that constitutes the lower insulating part 13 should not be particularly limited, but may be, for example, an insulative ceramic, such as alumina, an insulative resin, such as polyethylene, or the like. The lower insulating part 13 according to this embodiment has an annular shape that surrounds the outer circumference of the annular heater 11.

The showerhead 14 is arranged in the upper surface 10B (the other surface) side of the substrate 10, and is formed of a member that has a structure to supply a raw material gas G, which serves as a raw material of a film, toward the upper surface 10B. The showerhead 14 is arranged to face the heater 11 in parallel or substantially parallel thereto, with a predetermined distance therebetween. The raw material gas G supplied from showerhead 14 flows from the central side of the substrate 10 to the outer peripheral side along the upper surface 10B of the substrate 10, as indicated by arrows in FIG. 1. The specific structure of the showerhead 14 should not be particularly limited, but, for example, the showerhead 14 may be a member having a circular disk shape or the like that includes a plurality of holes through which the raw material gas G can be distributed. The composition of the raw material gas G should not be particularly limited, but, for example, the raw material gas G may be composed of a mixture gas containing $SiH_4$, $N_2O$, and $N_2$, a mixture gas containing $SiH_4$, $NH_3$, and $N_2$, a mixture gas containing TEOS and $O_2$, or the like. When a mixture gas containing $SiH_4$, $N_2O$, and $N_2$, or a mixture gas containing TEOS and $O_2$ is used as the raw material gas G, an $SiO_2$ film is formed. When a mixture gas containing $SiH_4$, $NH_3$, and $N_2$ is used as the raw material gas G, an SiN film is formed.

The upper electrode 15 is an electrode arranged around the showerhead 14. The upper electrode 15 according to this embodiment has an annual shape with an inner diameter larger than the outer diameter of the showerhead 14 having the circular disk shape. The upper electrode 15 is grounded.

The upper insulating part 16 is arranged between the showerhead 14 and the upper electrode 15 to block the electric conduction between the upper electrode 15 and the showerhead 14. The material that constitutes the upper insulating part 16 should not be particularly limited, but may be, for example, an insulative ceramic, such as alumina, an insulative resin, such as polyethylene, or the like. The upper insulating part 16 according to this embodiment has an annual shape that surrounds the outer circumference of the annular showerhead 14.

The power supply part 17 is set to output a radio frequency voltage with a predetermined frequency. The power supply part 17 according to this embodiment includes an alternate current (AC) power supply 21, a radio frequency amplifier 22, and a matching device 23. The AC power supply 21 is a power supply that supplies an AC voltage, and may be, for example, a commercial power supply or the like. The radio frequency amplifier 22 is a circuit that generates a radio frequency voltage from the output voltage of the AC power supply 21, and may be constituted by using, for example, a frequency multiplying circuit, a phase locked loop (PLL) circuit, or the like. The matching device 23 is a circuit that matches the impedance on the radio frequency amplifier 22 side with the impedance on the lower electrode 12 side.

When a radio frequency voltage is applied from the power supply part 17 to the lower electrode 12, a plasma region 25 that serves to turn the raw material gas G into plasma is formed between the lower electrode 12 and the upper electrode 15. At this time, since the electric conduction to the heater 11 and the showerhead 14 is blocked by the lower insulating part 13 and the upper insulating part 16, the plasma region is not formed on the central side of the substrate 10. This allows a film 31 to grow on the outer edge portion 20 of the substrate 10.

Figure 2:
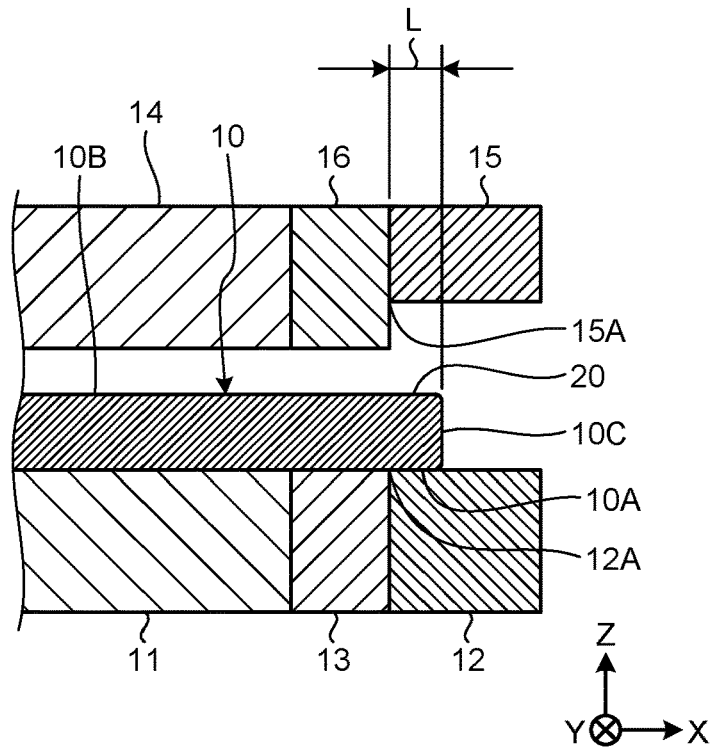
FIG. 2 is a partially enlarged sectional view illustrating an example of the relationship between a lower electrode, an upper electrode, and an outer edge portion, according to the embodiment.
Figure 3:
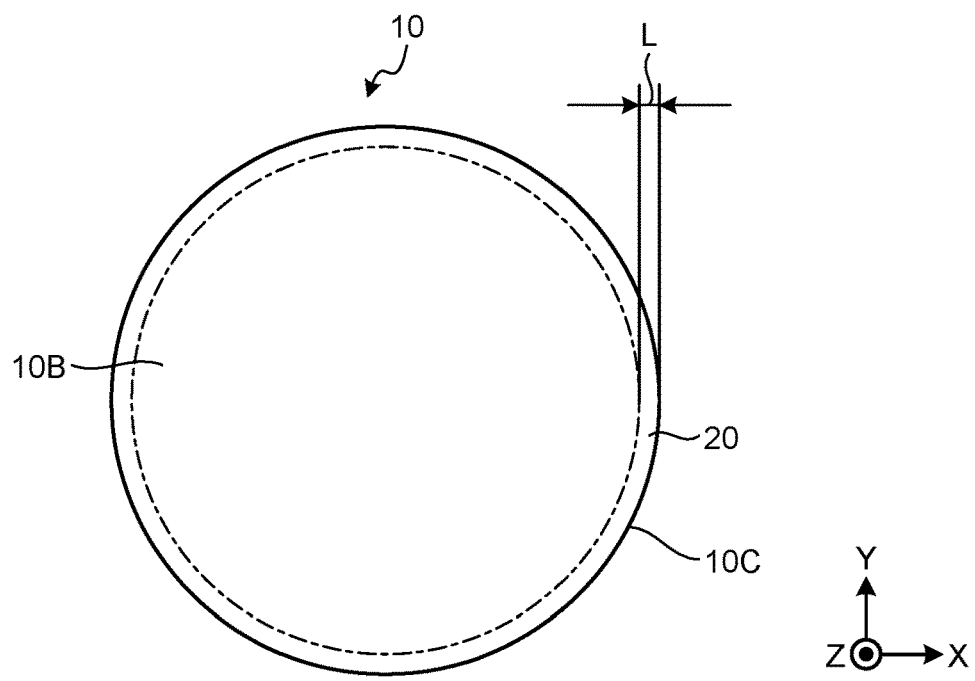
FIG. 3 is a top view illustrating an example of the outer edge portion according to the embodiment.

FIG. 2 is a partially enlarged sectional view illustrating an example of the relationship between the lower electrode 12, the upper electrode 15, and the outer edge portion 20, according to the embodiment. FIG. 3 is a top view illustrating an example of the outer edge portion 20 according to the embodiment.

As illustrated in FIG. 2, the lower electrode 12 and the upper electrode 15 according to this embodiment are arranged to overlap with the outer edge portion 20 of the substrate 10 in the direction in which the lower electrode 12 and the upper electrode 15 face each other (in the Z-axis direction in Drawings). As illustrated in FIGS. 2 and 3, the outer edge portion 20 is a region that exists from the outer peripheral end 10C of the substrate 10 to a position inside by a predetermined length L. In other words, in a direction parallel to the surface of the substrate 10 (in the X-axis direction in Drawings), the inner end 12A of the lower electrode 12 and the inner end 15A of the upper electrode 15 are positioned on the inner side by the predetermined length L from the outer peripheral end 10C of the substrate 10 (toward the central side of the substrate 10). The length L is preferably larger than 0 mm and 40 mm or less, and more preferably within a range of 25 mm to 35 mm. In addition, as illustrated in FIG. 2, the lower electrode 12 according to this embodiment is formed to be in contact with the lower surface 10A side part of the outer edge portion 20 of the substrate 10 placed thereon.

With the arrangement described above, in the plasma region 25 (see FIG. 1) formed between the lower electrode 12 and the upper electrode 15, lines of magnetic flux (electric field) are generated in parallel or substantially parallel to the direction in which the lower electrode 12 and the upper electrode 15 face each other (in the Z-axis direction in Drawings). This makes it possible to form a film in a flat state on the outer edge portion 20 of the substrate 10.

Figure 4:
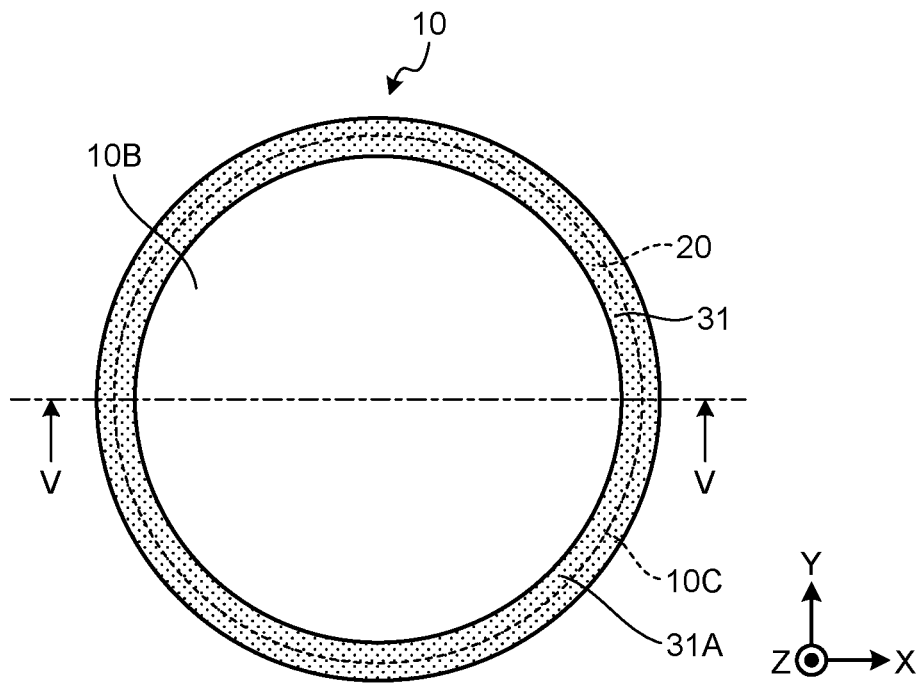
FIG. 4 is a top view illustrating an example of the state of a film formed by the semiconductor manufacturing apparatus according to the embodiment.
Figure 5:
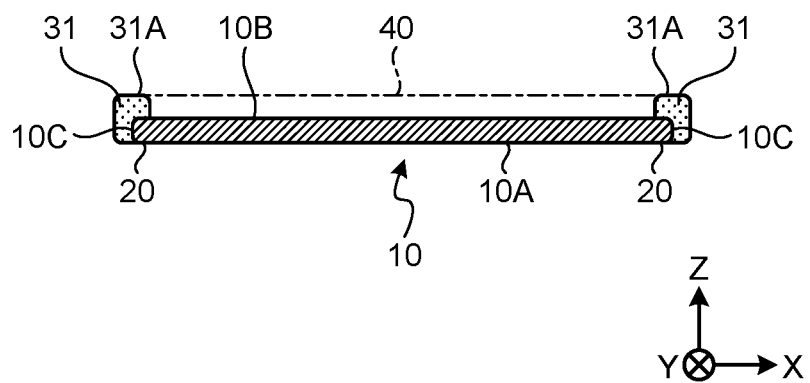
FIG. 5 is a sectional view taken along a line V-V illustrating an example of the state of the film formed by the semiconductor manufacturing apparatus according to the embodiment.

FIG. 4 is a top view illustrating an example of the state of a film 31 formed by the semiconductor manufacturing apparatus 1 according to the embodiment. FIG. 5 is a sectional view taken along a line V-V illustrating an example of the state of the film 31 formed by the semiconductor manufacturing apparatus 1 according to the embodiment.

As illustrated in FIGS. 4 and 5, the film 31 grows on the upper surface 10B side and the outer peripheral end 10C side of the outer edge portion 20. The reason why the film 31 does not grow on the lower surface 10A side of the outer edge portion 20 resides in that the lower electrode 12 is in contact with the lower surface 10A of the outer edge portion 20, as illustrated in FIGS. 1 and 2. Further, the upper side 31A of the film 31 is in a flat state (a shape substantially parallel to the upper surface 10B of the substrate 10). This is because, as described above, the plasma region 25 is generated between the lower electrode 12 the upper electrode 15 (a region in which the outer edge portion 20 is present), where lines of magnetic flux (electric field) exist in parallel or substantially parallel to the direction in which the lower electrode 12 and the upper electrode 15 face each other (in the Z-axis direction in Drawings).

Further, as illustrated in FIG. 5, that region of the upper surface 10B of the substrate 10, which is present on the inner side than the film 31 (or the outer edge portion 20), serves as a mounting region 40 on which various devices can be mounted. When the height of the upper side 31A of the film 31 (the thickness of the film 31 in the Z-axis direction) is matched to the height of devices to be mounted on the mounting region 40, it is possible to manufacture semiconductor devices such that the upper surfaces are in a flat state as a whole and unnecessary spaces are less likely to be formed between the film 31 and the devices.

As described above, with the semiconductor manufacturing apparatus 1 according to this embodiment, it is possible to form a film 31 in a flat state on the outer edge portion 20, which has a bevel shape, of the substrate 10.

It should be noted that the configuration described above is illustrated in which the lower electrode 12 is connected to the power supply part 17 and the upper electrode 15 is grounded, but a configuration may be adopted in which the lower electrode 12 is grounded and the upper electrode 15 is connected to the power supply part 17.

Next, an explanation will be given of a semiconductor device manufacturing method. A manufacturing method according to this embodiment is a method that manufactures two semiconductor devices by using the semiconductor manufacturing apparatus 1 described above, and then joins these two semiconductor devices to each other and thereby manufactures one semiconductor device.

Figure 6:
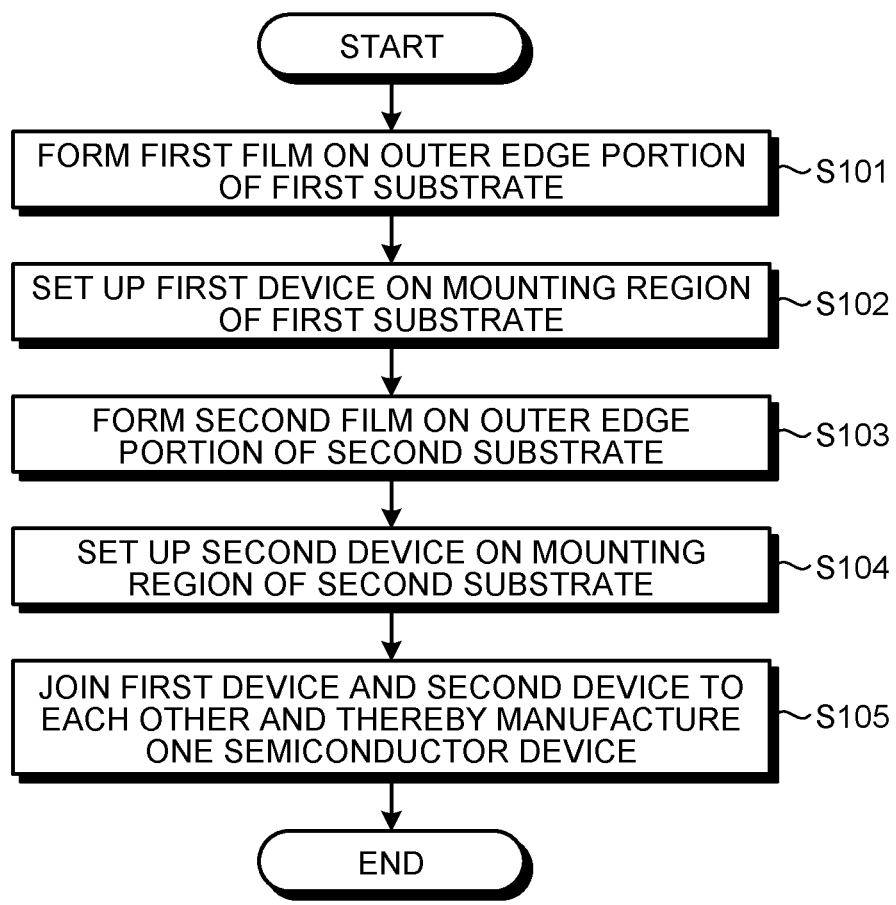
FIG. 6 is a flowchart illustrating an example of the steps of a semiconductor device manufacturing method according to the embodiment.
Figure 7:
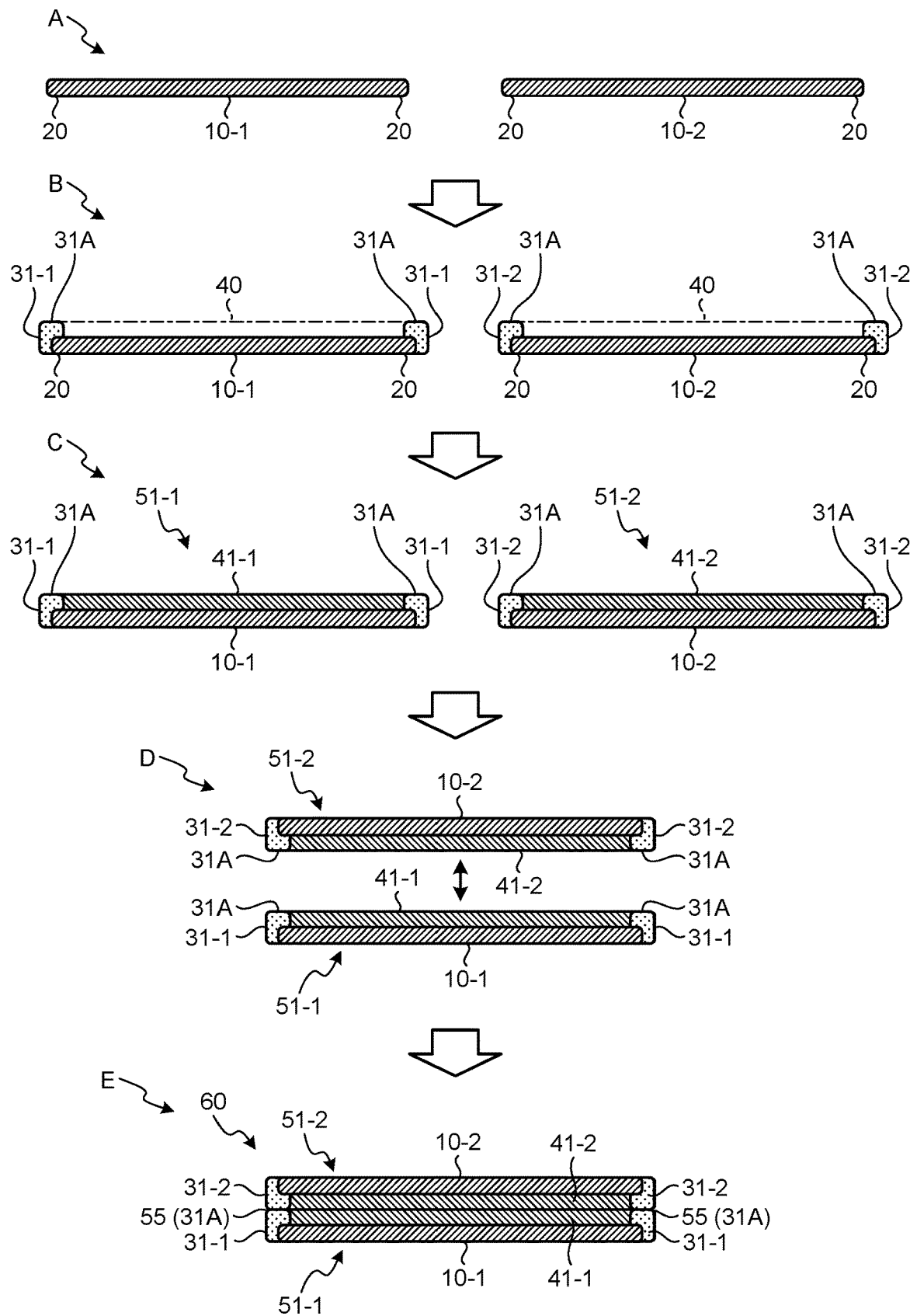
FIG. 7 is a diagram illustrating the example of the steps of the semiconductor device manufacturing method according to the embodiment.

FIG. 6 is a flowchart illustrating an example of the steps of a semiconductor device manufacturing method according to the embodiment. FIG. 7 is a diagram illustrating the example of the steps of the semiconductor device manufacturing method according to the embodiment.

A first film 31-1 is formed on an outer edge portion 20 of a first substrate 10-1 (FIG. 6: S101, FIG. 7: A and B) by using the semiconductor manufacturing apparatus 1 described above, and then a first device 41-1 is set up on a mounting region 40 of the first substrate 10-1 (FIG. 6: S102, FIG. 7: B and C). At this time, the first film 31-1 is formed such that the height of its upper side 31A is substantially the same as the height of the first device 41-1. Consequently, a first semiconductor device 51-1 is manufactured in which the upper surface side is in a flat state as a whole.

Then, a second film 31-2 is formed on an outer edge portion 20 of a second substrate 10-2 (FIG. 6: S103, FIG. 7: A and B) by using the semiconductor manufacturing apparatus 1 described above, and then a second device 41-2 is set up on a mounting region 40 of the second substrate 10-2 (FIG. 6: S104, FIG. 7: B and C). At this time, the second film 31-2 is formed such that the height of its upper side 31A is substantially the same as the height of the second device 41-2. Consequently, a second semiconductor device 51-2 is manufactured in which the upper surface side is in a flat state as a whole.

It should be noted that FIG. 6 illustrates an example in which the first semiconductor device 51-1 is first manufactured and the second semiconductor device 51-2 is then manufactured, but the first semiconductor device 51-1 and the second semiconductor device 51-2 may be manufactured at the same time, or the second semiconductor device 51-2 may be first manufactured and the first semiconductor device 51-1 may be then manufactured.

Then, the first device 41-1 of the first semiconductor device 51-1 and the second device 41-2 of the second semiconductor device 51-2 are joined to each other, and one semiconductor device 60 is thereby manufactured (FIG. 6: S105, FIG. 7: D and E). At this time, since the upper side 31A of the first film 31-1 and the upper side 31A of the second film 31-2 are in a flat state, the contact surface 55 between the first film 31-1 and the second film 31-2 is made into a flat state. Further, almost no unnecessary spaces are formed between the first film 31-1 and the first device 41-1 and between the second film 31-2 and the second device 41-2. Therefore, the first semiconductor device 51-1 and the second semiconductor device 51-2 can be joined together with high adhesion.

As described above, with the semiconductor device manufacturing method according to this embodiment, it is possible to manufacture the semiconductor device 60, which is composed of the two semiconductor devices 51-1 and 51-2 joined together, with high quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
a heating part arranged to be at one surface side of a substrate;
a first electrode arranged around the heating part;
a first insulating part arranged between the heating part and the first electrode;
a gas supply part arranged to be at another surface side of the substrate, and including a structure to supply a gas toward the other surface; and
a second electrode arranged around the gas supply part; and
a second insulating part arranged between the gas supply part and the second electrode,
wherein
the first electrode and the second electrode are arranged to overlap with an outer edge portion of the substrate, which is a region existing from an outer peripheral end of the substrate to a position inside by a predetermined length, in a direction in which the first electrode and the second electrode face each other, and
the first electrode is arranged to be in contact with part of the outer edge portion on the one surface side of the substrate.

2. The semiconductor manufacturing apparatus according to claim 1, wherein the predetermined length is 40 mm or less.

3. The semiconductor manufacturing apparatus according to claim 1, wherein the predetermined length is within a range of 25 mm to 35 mm.

4. The semiconductor manufacturing apparatus according to claim 1, wherein
the first electrode is connected to a power supply part configured to supply a voltage with a predetermined frequency, and
the second electrode is grounded.

5. The semiconductor manufacturing apparatus according to claim 1, wherein the gas is a mixture gas containing $SiH_4$, $N_2O$, and $N_2$.

6. The semiconductor manufacturing apparatus according to claim 1, wherein the gas is a mixture gas containing $SiH_4$, $NH_3$, and $N_2$.

7. The semiconductor manufacturing apparatus according to claim 1, wherein the first insulating part has an annular shape.

8. The semiconductor manufacturing apparatus according to claim 1, wherein the second insulating part has an annular shape.

9. The semiconductor manufacturing apparatus according to claim 1, wherein the first insulating part contains alumina or polyethylene.

10. The semiconductor manufacturing apparatus according to claim 1, wherein the second insulating part contains alumina or polyethylene.

11. A semiconductor device manufacturing method for manufacturing a semiconductor device by using a semiconductor manufacturing apparatus,
the semiconductor manufacturing apparatus including
a heating part arranged to be at one surface side of a substrate,
a first electrode arranged around the heating part,
a first insulating part arranged between the heating part and the first electrode, a gas supply part arranged to be at another surface side of the substrate, and including a structure to supply a gas toward the other surface, and a second electrode arranged around the gas supply part, and a second insulating part arranged between the gas supply part and the second electrode, wherein the first electrode and the second electrode are arranged to overlap with an outer edge portion of the substrate, which is a region existing from an outer peripheral end of the substrate to a position inside by a predetermined length, in a direction in which the first electrode and the second electrode face each other, and the first electrode is arranged to be in contact with part of the outer edge portion on the one surface side of the substrate, the method comprising:

forming a first film on an outer edge portion, which has a bevel shape, of a first substrate by using the semiconductor manufacturing apparatus;

setting up a first device on a region of the first substrate on an inner side than the first film;

forming a second film on an outer edge portion, which has a bevel shape, of a second substrate by using the semiconductor manufacturing apparatus;

setting up a second device on a region of the second substrate on an inner side than the second film; and overlaying the first device and the second device with each other, wherein a contact surface between the first film and the second film is in a flat state.

12. The semiconductor device manufacturing method according to claim 11, wherein the predetermined length is 40 mm or less.

13. The semiconductor device manufacturing method according to claim 11, wherein the predetermined length is within a range of 25 mm to 35 mm.

14. The semiconductor device manufacturing method according to claim 11, wherein the first electrode is connected to a power supply part configured to supply a voltage with a predetermined frequency, and the second electrode is grounded.

15. The semiconductor device manufacturing method according to claim 11, wherein the gas is a mixture gas containing $SiH_4$, $N_2O$, and $N_2$.

16. The semiconductor device manufacturing method according to claim 11, wherein the gas is a mixture gas containing $SiH_4$, $NH_3$, and $N_2$.

17. The semiconductor device manufacturing method according to claim 11, wherein the first insulating part has an annular shape.

18. The semiconductor device manufacturing method according to claim 11, wherein the second insulating part has an annular shape.

19. The semiconductor device manufacturing method according to claim 11, wherein the first insulating part contains alumina or polyethylene.

20. The semiconductor device manufacturing method according to claim 11, wherein the second insulating part contains alumina or polyethylene.

* * * * *